United States Patent [19]

Greene

[11] 4,229,700

[45] Oct. 21, 1980

[54] BURIED REED, EXTRA-SHORT PULSE WIDTH PULSER

[76] Inventor: Hugh W. Greene, P.O. Box 8, Sommerville, Ala. 35670

[21] Appl. No.: 964,003

[22] Filed: Nov. 27, 1978

[51] Int. Cl.[3] .......... H03K 5/06; H03K 3/02; H03K 3/45; H03K 3/53

[52] U.S. Cl. .......... 328/65; 333/254; 333/258; 333/260; 328/66

[58] Field of Search .......... 333/254, 258, 259, 260; 328/59, 65, 66

[56] References Cited

U.S. PATENT DOCUMENTS

| | | | |
|---|---|---|---|
| 3,188,582 | 6/1965 | Bowness | 333/254 X |
| 3,333,203 | 7/1967 | Baker | 328/59 |
| 3,555,465 | 1/1971 | Kuroda et al. | 333/258 X |
| 4,150,348 | 4/1979 | Foltz | 333/258 X |

*Primary Examiner*—John S. Heyman

*Attorney, Agent, or Firm*—Nathan Edelberg; Robert P. Gibson; Freddie M. Bush

[57] ABSTRACT

A buried reed, extra-short pulse width pulser is an extra fast rise and fall time short pulse width pulser with very high voltage output. A typical pulser may have a 10 picosecond rise and fall time, a 500 picosecond flat top time, and up to a 1000 volt output. The output impedance of the pulser is normally 50 ohms. A reed switch provides switching between a center conductor of a charged line and an output line to provide the output pulses. The reed switch is buried within the pulser forming an integral part of the center conductors.

9 Claims, 2 Drawing Figures

BURIED REED, EXTRA-SHORT PULSE WIDTH PULSER

DEDICATORY CLAUSE

The invention described herein may be manufactured, used, and licensed by or for the Government for governmental purposes without the payment to me of any royalties thereon.

BACKGROUND OF THE INVENTION

Many attempts have been made to create a very fast rise time, very short pulse width pulser with the ability of high voltage output. Success at such an approach has been only partial. Solid state pulsers have been built which meet the rise time and pulse width requirements but are limited to a volt or less in amplitude. Pulsers with near 100 volts amplitude have been built but could not meet the rise time or pulse width requirements, or could not meet the single pulse with no distortion or reflections requirements.

SUMMARY OF THE INVENTION

A Mercury wetted, magnet operated, reed switch is buried within and forms a conductive part of a center conductor so as not to present an impedance mismatch which would distort a pulse and create reflections within a coaxial transmission line system. The reed switch provides switching between a center conductor of a charged line and a center conductor of an output line. The lines are separated only by an electrically insulating washer and not by the length of the reed switch, the reed switch being buried coaxially within adjacent ends of the center conductors. In activating the reed switch, advantage is taken of the shorted turn created by the housing structure by inducing a very high current in the housing which in turn creates a magnetic field and closes the reed switch. This allows activation of the reed switch inside a conducting coaxial transmission line with no physical modifications made to the line itself.

DESCRIPTION OF THE PREFERRED EMBODIMENT

Figure 1:
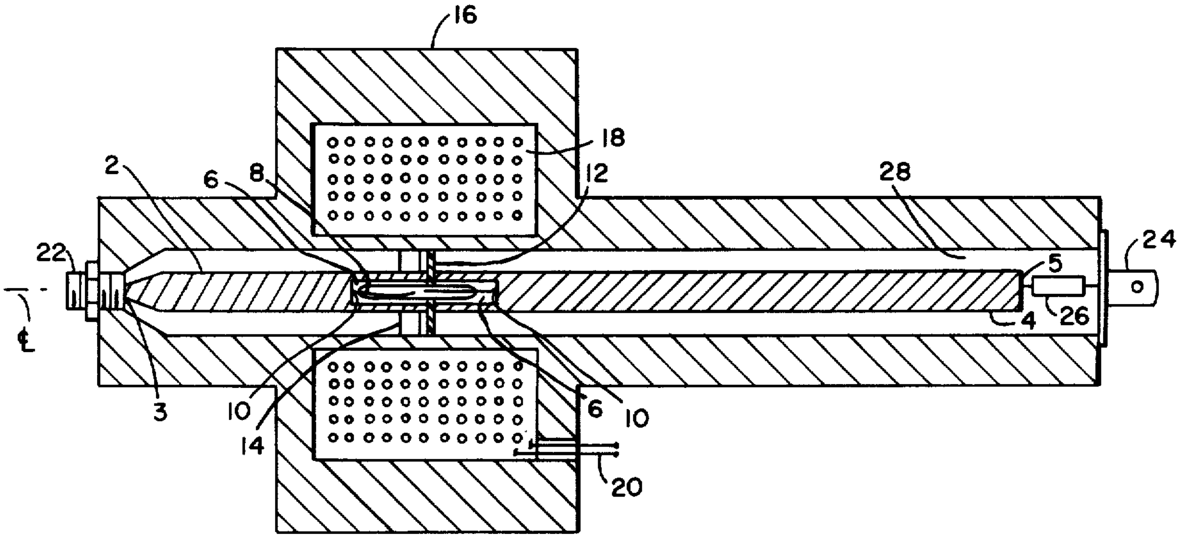
FIG. 1 is a sectional view of a preferred embodiment of a buried reed pulser with extraneous components omitted.

Referring now to the drawings, wherein FIG. 1 discloses a preferred embodiment of the pulser, a center conductor 2 is the output coaxial transmission line and is disposed in coaxial alignment with a center conductor 4, which is the input and storage portion of the transmission line. Adjacent ends of the center conductors have cylindrical holes 6 drilled coaxially therein for encompassing and supporting a reed switch 8. Reed switch 8, coaxially aligned with conductors 2 and 4, has the electrical switching components thereof soldered, welded, or otherwise coupled at respective points 10 within cavities 6 of the center conductors. A spacer washer 12 provides electrical insulation between and prevents arcing between the output center conductor 2 and the storage center conductor 4 as well as providing a change in dielectric constant which maintains a 50 ohm impedance where the main center conductor is not present. Washer 12 may, for example, be the product polytetrafluorethylene, sold under the trademark Teflon. A 50 ohm coaxial terminator resistor 14 is coupled to the end of a conductor 2 adjacent washer 12 and prevents line reflections in addition to supporting the center conductor. A cylindrical metal case or housing 16 encompases conductors 2 and 4 and reed 8. Metal housing 16 functions as the outer part of an air core coaxial transmission line and further houses a drive coil 18 which is used to magnetically switch reed 8. Conductors 20 are adapted for receiving external power supply connections and provide the input signals to drive coil 18, which is imbedded within housing 16 circumferentially around the end portions of conductors 2 and 4 which houses reed switch 8 for uniformly applying a magnetic field to drive the reed switch. A coaxial output connector 22 is coupled to an end 3 of conductor 2 for providing an undistorted output pulse from the conductor to output circuitry. An SMA type connector will provide this coupling. Similarly, a coaxial input connector 24 is coupled through a high resistance charge resistor 26 to an end 5 of conductor 4, which allows charging of the storage portion of the transmission line but resistively isolates the charging power supply during the pulse cycle so as not to distort the pulse. Housing 16 provides an air chamber 28 around the circumference of the conductors. The driving voltage for the coil is electrically isolated from housing 16 which is magnetically coupled with the coil for uniformly applying the magnetic field.

The minimum thickness of washer 12 is based on the voltage standoff required to prevent arcing between conductors 2 and 4 and is nominally about 0.050 inches. The spacer washer completely fills the gap between the center conductors and has a dielectric strength and dielectric constant which prevents the arcing and maintains the 50 ohm impedance where the main center conductor is not present. The transmission line impedance, as for example 50 ohms, is a function of the ratio of the inner diameter of housing 16 to the outer diameters of the coaxial lines 2 and 4 and the dielectric constant of the core. The reed being buried within the ends of the center conductors and encompassed by the washer, allows the impedance of the transmission line to appear uniform, otherwise distortions would occur.

Figure 2:
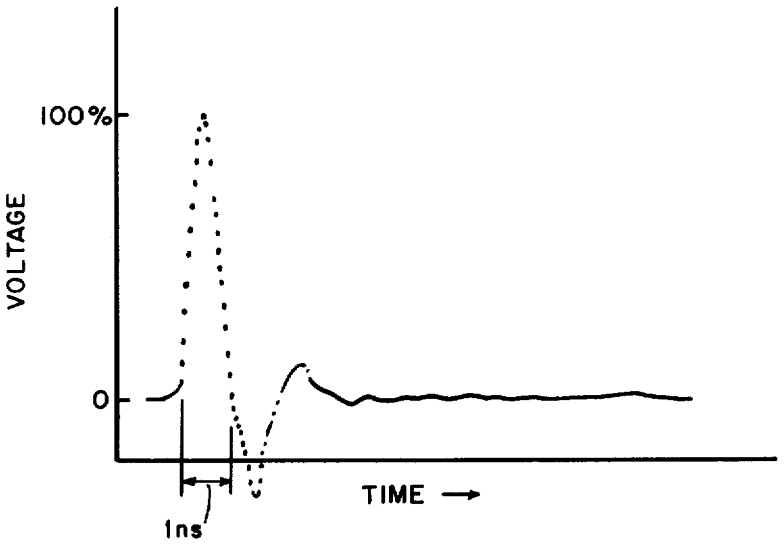
FIG. 2 is a typical pulse wave form diagram of an output pulse from the pulser.

FIG. 2 discloses the typical undistorted pulse signal output obtained from the buried reed pulser. The pulse riser time is approximately 100 picoseconds for the example pulse and has a pulse width of one nanosecond.

In operation of the pulser, a high voltage power supply (not shown) is connected to input coaxial connector 24 and set to the desired voltage which corresponds to the required output pulse amplitude. The charge portion 4 of the air core coaxial line is then charged through charge resistor 26 and soon reaches its steady state. Current is then applied through the drive coil 18. Current is induced in the case structure 16 and this circulating current produces an internal magnetic field which closes the mercury wetted reed switch 8. The stored voltage on conductor 4 is then transferred through the reed switch and through output coaxial transmission line 2 to the output connector 22, for coupling to load circuitry. Line 2 may be relatively short and need only be long enough for smooth transition to the output connector. The pulse is not distorted since it never encounters an impedance other than 50 ohms and is immediately terminated in its characteristic impedance when it is transferred to the output portion of the transmission line. The pulse does not have a long tail since it is isolated by a very large charge resistor 26. The pulse length is controlled by the length of the charge portion 4 of the transmission line. For example a one foot line 4 will produce approximately a 1 nanosecond pulse width and a 2 foot line will produce approximately a 2 nanosecond pulse width. The pulser is essentially a single pulse system but can be operated as high as 1000 pulses per second.

Earlier techniques for activating a magnet reed switch pulser requires and air gap longitudinally along the case of the pulser to eliminate the case or housing as a shorted winding within the transformer or magnetic coil. This air gap affects the line impedance and field uniformity thus distorting the output pulse. The buried reed pulser, which has an ultra fast rise time, takes advantage of the shorted turn created by the case or housing structure by inducing a very high current in the case which in turn creates a magnetic field which closes the reed switch. This activates the reed switch inside the conducting coaxial transmission line with no modifications made to the line itself. The spacer washer 12 which encompasses and supports the reed within the housing maintains a 50 ohm impedance to the signal or pulse where the main center conductor is not present and the pulse is passing through the reed switch.

The voltage output for the pulser is much higher than anything known with picosecond rise times. The system has been operated at 1000 volts and has been used regularly at 300 volts. Pulse widths as short as 250 picoseconds can be obtained. Rise times as short as 10 picoseconds are possible depending on the accuracy of the construction of the system in avoiding impedance mismatch.

Although a particular embodiment and form of this invention has been illustrated, it is apparent that various modifications and embodiments of the invention may be made by those skilled in the art without departing from the scope and spirit of the forgoing disclosure. Accordingly, the scope of the invention should be limited only to the claims appended hereto.

I claim:

1. A buried reed, short pulse width pulser comprising: first and second coaxial conductors disposed coaxially aligned with respective first ends thereof substantially adjacent, coupling means electrically connected between respective first ends of said coaxial conductors for controllably providing an electrical path therebetween, gating means coaxially disposed circumferentially around said coupling means and said conductor ends for controllably activating said coupling means, cylindrical housing means encompassing said gating means, coupling means, and coaxial conductors, said housing means being electrically conductive, first and second connecting means, said first connecting means being coupled to the second end of said second conductor for providing electrical coupling external to said housing, said second connecting means being coupled to the second end of said first conductor for providing output coupling from said conductor external to said housing.

2. A buried reed pulser as set forth in claim 1 and further comprising spacing means adjacent said first end of said first conductor for maintaining said conductors spaced apart from an interior surface of said housing means, insulating means disposed between said first ends of said first and second conductors and circumferentially enclosing a portion of said coupling means for insulating and separating said conductors and supporting said coupling means therebetween, and resistive means coupled between the second end of said second conductor and the first connector means.

3. A buried reed pulser as set forth in claim 2 wherein said coupling means is a reed switch and said gating means is a coil adapted for external electrical stimulation to develop a magnetic field within said housing chamber for activating said reed switch.

4. A buried reed pulser as set forth in claim 3 wherein said first ends of said coaxial conductors have respective coaxial chambers therein adapted for receiving said reed switch coaxially therein.

5. A buried reed pulser as set forth in claim 4 wherein said resistance means is a high resistance charge resistor for resistively isolating a charging power supply during closed or activated periods of the reed switch for preventing distortion of output pulses, and wherein said reed switch is a mercury wetted, magnetically activated switch.

6. A buried reed pulser as set forth in claim 5 wherein said insulating means is polytetrafluorethylene for insulatingly supporting said reed switch within said housing chamber and said coaxial conductor end chambers, and said spacing means is a 50 ohm coaxial resistor for preventing line reflections in said first conductor.

7. A buried reed pulser as set forth in claim 6 wherein said first ends of said coaxial conductors are separated only by said insulating means, said reed switch being substantially buried within said coaxial conductor chambers, said insulating means being of a minimum thickness required to prevent arcing between the first ends of said coaxial conductors, thereby allowing the impedance to appear uniform.

8. A buried reed pulser as set forth in claim 7 wherein said second coaxial conductor is adapted to receive a desired high voltage charge through said resistance means, and said first coaxial conductor is adapted to receive said voltage charge for output coupling an undistorted voltage pulse when said reed switch is in a closed state, thereby providing a buried reed, short pulse width pulser.

9. A buried reed pulser as set forth in claim 8 wherein the output voltage pulse length is controlled by the length of said second coaxial conductor.

* * * * *